United States Patent [19]

Murata et al.

[11] 4,321,612
[45] Mar. 23, 1982

[54] SCHOTTKY BARRIER CONTACT TO COMPOUND SEMICONDUCTOR WITH THREE LAYER REFRACTORY METALIZATION AND HIGH PHOSPHOROUS CONTENT GLASS PASSIVATION

[75] Inventors: Eiji Murata, Fuchu; Hideaki Izumi, Yokohama; Atuko Sugawara, Kawasaki; Susumu Okano, Yokosuka, all of Japan

[73] Assignee: Tokyo Shibaura Denki Kabushiki Kaisha, Kawasaki, Japan

[21] Appl. No.: 109,080

[22] Filed: Jan. 2, 1980

[30] Foreign Application Priority Data

Jan. 24, 1979 [JP] Japan .................................. 54-6116

[51] Int. Cl.³ ............................................ H01L 29/48
[52] U.S. Cl. .................................. 357/15; 357/52; 357/71; 357/73
[58] Field of Search .................. 357/73, 15, 54, 52, 357/71

[56] References Cited

U.S. PATENT DOCUMENTS

| | | | |
|---|---|---|---|
| 3,489,953 | 1/1970 | Thomas | 357/73 |
| 3,575,743 | 4/1971 | Chiovarou et al. | 357/73 |
| 3,617,929 | 11/1971 | Strack et al. | 357/73 |
| 3,632,433 | 1/1972 | Tokuyama et al. | 357/73 |
| 3,716,765 | 2/1973 | Rueffer et al. | 357/73 |
| 4,079,504 | 3/1978 | Kosa | 357/73 |

FOREIGN PATENT DOCUMENTS

| | | | |
|---|---|---|---|
| 52-21782 | 2/1977 | Japan | 357/73 |
| 1151499 | 5/1969 | United Kingdom | |
| 1272033 | 4/1972 | United Kingdom | |

OTHER PUBLICATIONS

Y. Sato et al., "GaAs Schottky Barrier Diodes, ECL-1314," Electr. Comm. Lab. Tech. J., vol. 18 #7, 1969, pp. 1717-1727.

A. Nara et al., "High Performance Ni-Pd/GaAs Sch. Barr. Diodes," 9th Conf. S.—S. Dev., Tokyo, C-2-4, 1977, pp. 55, 56.

P. Totta et al., "Low Barrier HT . . . Process," IBM Tech. Discl. Bull., vol. 20 #11B, Apr. 1978, pp. 4812, 4813.

Primary Examiner—Joseph E. Clawson, Jr.
Attorney, Agent, or Firm—Oblon, Fisher, Spivak, McClelland & Maier

[57] ABSTRACT

A Schottky barrier type compound semiconductor device includes an N type compound semiconductor substrate, an insulation layer having a penetrating hole through which part of the substrate is exposed, and a layer of high melting metal formed through the penetrating hole to form a Schottky barrier with the substrate. The insulation layer includes a phosphosilicate glass layer containing phosphorus at a concentration of $1 \times 10^{21}$ /cm³ or more and contacting the substrate.

7 Claims, 11 Drawing Figures

F I G. 3F 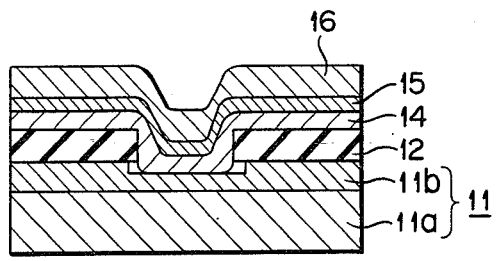
F I G. 3G 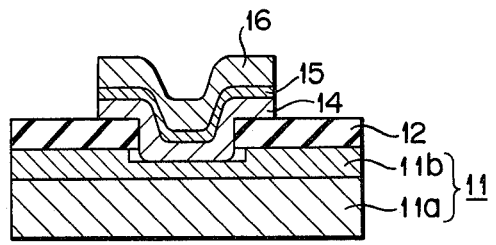
F I G. 3H 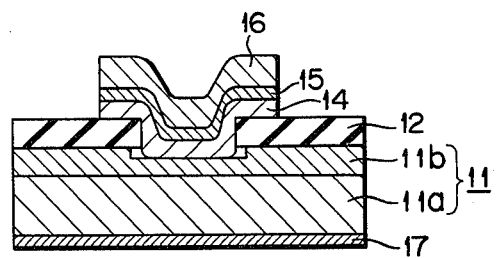
F I G. 4 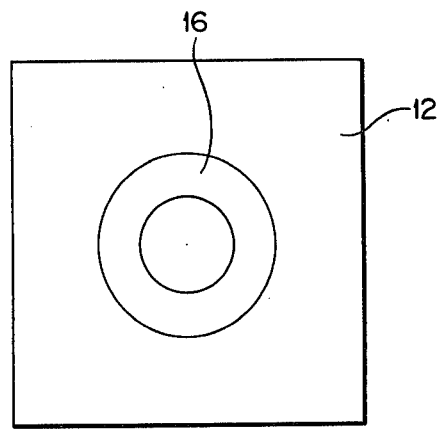

SCHOTTKY BARRIER CONTACT TO COMPOUND SEMICONDUCTOR WITH THREE LAYER REFRACTORY METALIZATION AND HIGH PHOSPHOROUS CONTENT GLASS PASSIVATION

BACKGROUND OF THE INVENTION

1. Field of the Invention

This invention relates to a Schottky barrier type compound semiconductor device and more particularly to a Schottky barrier type compound semiconductor device provided with an improved insulation layer.

2. Description of the Prior Art

Particularly known among Schottky barrier type compound semiconductor devices is the type in which a layer of, for example, titanium, platinum, molybdenum, or tungsten is mounted on a substrate prepared from gallium arsenide. Also known in recent years is a compound semiconductor device in which the Schottky barrier is formed by, for example, a metal such as niobium, tantalum, or vanadium, as set forth in the Japanese Patent Application Disclosures 36,878 (1976) and 60,568 (1976).

Most of the compound semiconductor devices of the above-mentioned type are constructed by forming an insulation layer on an N type gallium arsenide substrate, making a hole in the insulation layer, mounting a Schottky barrier-forming metal layer on the substrate through the hole and further depositing on said Schottky barrier metal layer another metal layer used to bond the compound semiconductor device to an external element. Already proposed are Schottky barrier type compound semiconductor devices whose insulation layer is formed of silicon dioxide (refer to "GaAs Schottky Barrier Diodes ECL-134" by Yasuo Sato et al appearing in "Electrical Communication Laboratories Technical Journal", Vol. 18, No. 7 (1969), pp. 1,717 and "High Performance Ni-Pd/GaAs Schottky Barrier Diodes" by A. Nara et al disclosed in "Digests of Technical Papers in the 9th Conference on Solid State Device, Tokyo", C-2-4 (1977), pp. 55). However, the proposed Schottky barrier type compound semiconductor devices have the drawback that the above-mentioned insulation layer of silicon dioxide has a thermal expansion coefficient widely different from that of the substrate crystal, giving rise to cracks in said insulation layer or its peeling from the substrate during heat treatment. Therefore, another Schottky barrier type compound semiconductor device has been proposed in which the insulation layer is formed of phosphosilicate glass (PSG) prepared by doping a silicon dioxide layer with phosphorus at a low concentration of, for example, ca. $3 \times 10^{20}/cm^3$.

Even the last mentioned Schottky barrier type compound semiconductor device still has the drawbacks, as experimentally disclosed by the present inventors, that (1) the PSG layer tends to peel from the substrate during the thermal deposition of a Schottky barrier-forming metal layer or during the subsequent heat treatment; (2) the bonding of the semiconductor device to an external element increases the capacitance of the Schottky barrier; (3) break-down voltage falls; and (4) undesirable increases arise in the n value denoting the forward voltage-current property, thus lowering the yield of the product.

SUMMARY OF THE INVENTION

It is accordingly the object of this invention to provide a Schottky barrier type compound semiconductor device which has a high Schottky barrier property and can be manufactured with good yield.

To this end, the invention provides a Schottky barrier type compound semiconductor device comprising:

an N type compound semiconductor substrate;

an insulation layer including a phosphosilicate glass film containing phosphorus at a concentration of $1 \times 10^{21}/cm^3$ or more, the insulation layer having a penetrating hole through which part of said N type compound semiconductor substrate is exposed; and a metal layer including a film of high melting metal which is formed through said penetrating hole to form a Schottky barrier with said substrate.

BRIEF DESCRIPTION OF THE DRAWING

This invention can be more fully understood from the following detailed description when taken in conjunction with the accompanying drawings, in which:

FIGS. 3A to 3H are sectional views showing the sequential steps of manufacturing a Schottky barrier type compound semiconductor device according to this invention; and FIG. 4 is a plan view of FIG. 3H.

DESCRIPTION OF THE PREFERRED ENVIRONMENT

This invention is based on the present inventors' discovery that if the concentration of phosphorus in a phosphosilicate glass layer directly deposited on an N type compound semiconductor substrate is properly controlled, then the phosphosilicate glass layer less tends to peel from the compound substrate and a decline in the general properties of a Schottky barrier type compound semiconductor device can be reduced.

Figure 1:
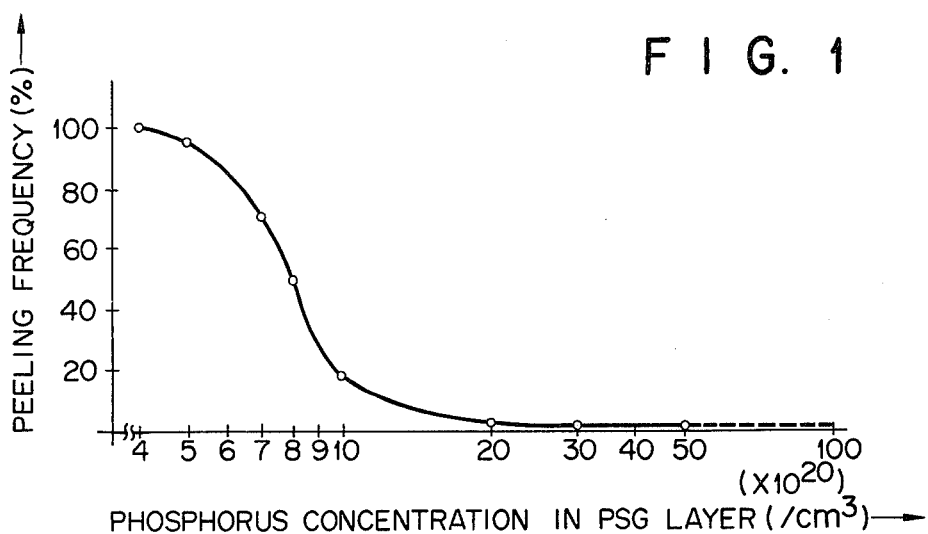
FIG. 1 is a graph showing the relationship between the concentration of phosphorus in a phosphosilicate glass layer and the frequency at which the phosphosilicate glass layer peels from a compound semiconductor substrate.

The present inventors have conducted an experiment that phosphosilicate glass (PSG) layers containing different concentrations of phosphorus were deposited on an N type gallium arsenide substrate containing an impurity at the surface concentration of 5 to $15 \times 10^{17}/cm^3$ with a thickness ranging between 0.3 and 1.5 microns. The sample PSG layers were provided with a penetrating hole. A Schottky barrier-forming metal of high melting point, for example, niobium was evaporation-deposited through the penetrating hole on the N type gallium arsenide substrate at a temperature of about 300° C. with a thickness of 500 to 2,000 A. Thereafter, the resulting structure was heat treated (alloying of Nb and GaAs) at a temperature of about 500° C. Determination was made of the frequency at which the PSG layer peeled from the substrate, the results being set forth in FIG. 1. FIG. 1 shows that a PSG layer containing phosphorus at a lower concentration than $1 \times 10^{21}/cm^3$ peels from the N type gallium arsenide substrate at a higher frequency than 20%, whereas a PSG layer containing phosphorus at a concentration of $1\times 10^{21}/cm^3$ or more peels from said N type gallium arsenide substrate at a lower frequency than 20%, that is, at such a low level of frequency as allows for the reliable manufacture of a Schottky barrier type compound semiconductor device. The reason for the above-mentioned decrease in the frequency of the peeling of the PSG layer is assumed to be that (1) as the PSG layer contains a higher concentration of phosphorus, the gallium arsenide substrate is more saved from deformation resulting from the formation of the PSG layer; and (2) the thermal expansion coefficient of the PSG layer increases to reduce a difference from that of the gallium arsenide substrate, leading to a decline in the thermal strain of the whole mass of said Schottky barrier type compound semiconductor device.

Figure 2:
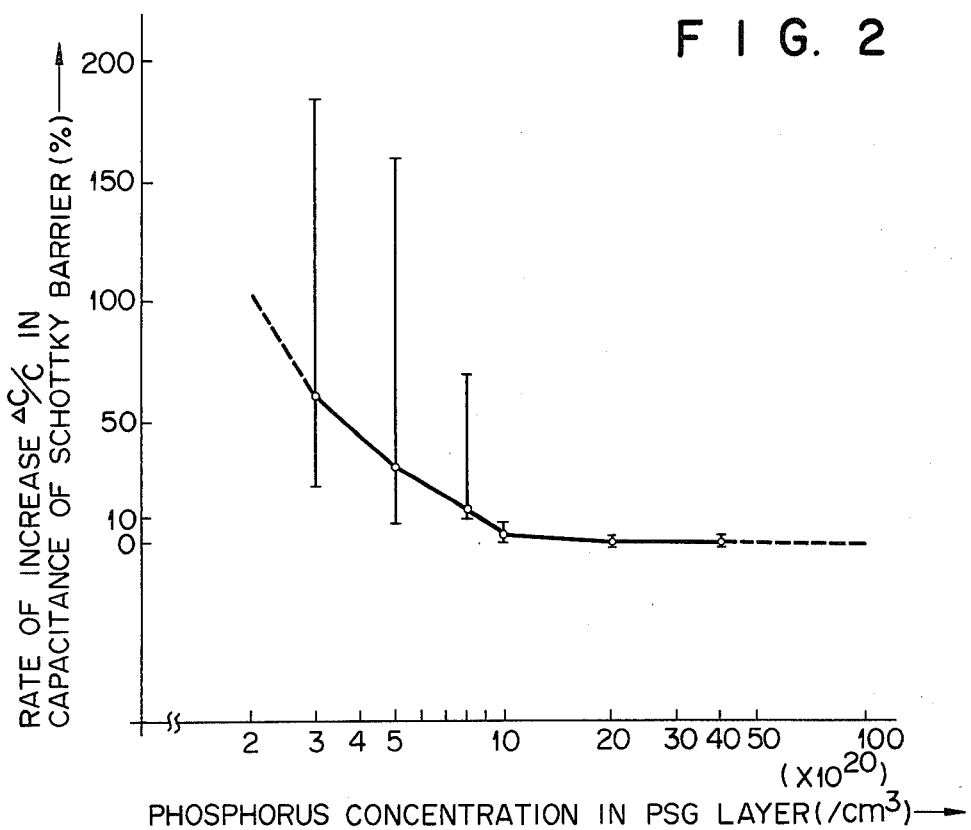
FIG. 2 is a graph showing the relationship between the concentration of phosphorus in the phosphosilicate glass layer and an increase in the capacitance of a Schottky barrier formed by the die bonding.

Next, determination was made of an increase ($\Delta C/C$) in the capacitance of the Schottky barrier of the sample gallium arsenide type semiconductor devices when bonded to an external element, the results being set forth in FIG. 2. FIG. 2 shows that where a PSG layer contains phosphorus at a lower concentration than $1\times 10^{21}/cm^3$, then the Schottky barrier capacitance increases more than 10%, that is, to such a level as is unadapted for the manufacture of a Schottky barrier type compound semiconductor device, whereas a PSG layer containing phosphorus at a concentration of $1\times 10^{21}/cm^3$ or more restricts an increase in the Schottky barrier capacitance to a lower level than 10%, that is, such a level as fully satisfactory as a final Schottky barrier type compound semiconductor device.

An upper limit to the concentration of phosphorus in the PSG layer is generally taken to be the saturated concentration (of the order of about $10^{22}/cm^3$) of phosphorus in the $SiO_2$ layer. Too high a concentration of phosphorus in the PSG layer leads to a decline in the moisture proofness of the PSG layer. Therefore, the phosphorus concentration in the PSG layer is usually chosen to be 2 to $5\times 10^{21}/cm^3$ or preferably 3 to $4\times 10^{21}/cm^3$. Obviously, the PSG layer can be saved from a decline in moisture proofness by sealing a Schottky barrier type compound semiconductor device in a highly airtight envelope, or taking the later described measure.

A Schottky barrier-forming metal used in this invention has a high melting point as about 2,000° C. to about 4,000° C. The metal includes, for example, niobium, tantalum, vanadium, tungsten, hafnium and molybdenum. A soft metal such as gold, silver or platinum to be mounted on a layer of any of the above-listed high melting metals for the bonding of a Schottky barrier type compound semiconductor device to an external element sometimes tends to be alloyed with said high melting metal during heat treatment, thereby deteriorating the general properties of the semiconductor device. To prevent such difficulties, it is preferred to use niobium, tantalum, vanadium or hafnium as a Schottky barrier-forming metal, mount molybdenum or tungsten as an intermediate layer on said Schottky barrier-forming metal and then deposit the above-mentioned soft metal on said intermediate layer.

There will now be described by reference to FIGS. 3A to 3H the manufacture of a Schottky barrier type compound semiconductor device embodying this invention which is applied as a mixer diode. An N type gallium arsenide layer 11b containing a donor at a concentration of about $5\times 10^{16}/cm^3$ is deposited by vapor phase epitaxial growth with a thickness of about 0.25 micron on an N+ type gallium arsenide substrate 11a having a specific resistance of about $1\times 10^{-3}\,\Omega.cm$, thus providing N type GaAs body 11.

Figure 3A:
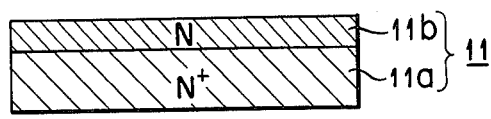
Figure 3B:
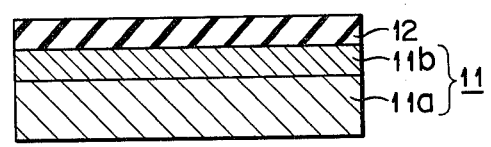
Figure 3C:
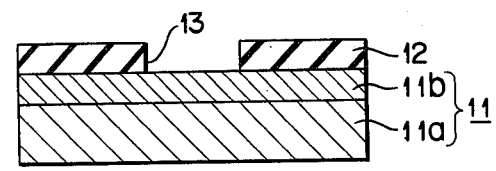
Figure 3D:
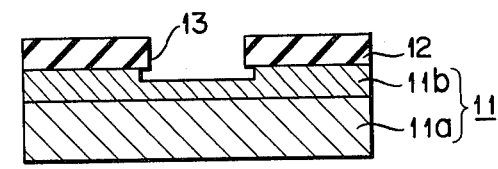

A PSG layer 12 containing phosphorus at a concentration of about $4\times 10^{21}/cm^3$ is deposited on the epitaxially grown layer 11b by chemical vapor deposition with a thickness of about 6,000 Å (FIG. 3B). The phosphorus content of the PSG layer 12 can be freely controlled within the scope claimed by this invention, for example, by varying the flow rate of gaseous phosphine with its concentration kept unchanged relative to silane. A penetrating hole 13 is formed in the PSG layer 12 by photoetching to expose part of the epitaxially grown layer 11b (FIG. 3C). The exposed surface of the epitaxially grown layer 11b is slightly etched (to an extent of about 0.1 to 0.2 micron) through the penetrating hole 13 to remove that portion of said exposed surface which was denatured by the deposition of the PSG layer (FIG. 3D).

Figure 3E:
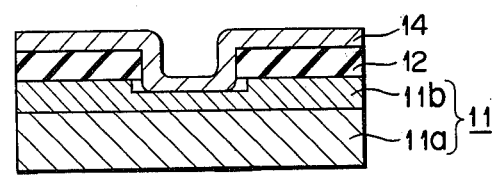

A layer 14 of a high melting Schottky barrier forming metal, for example, niobium is thermally deposited in vacuum on the substrate 11 to a thickness of about 2,000 Å (FIG. 3E). A layer 15 of molybdenum and a layer 16 of gold are thermally deposited in vacuum on the Schottky barrier-forming niobium layer 14 to a thickness of about 1,500 Å and a thickness of 10,000 Å respectively (FIG. 3F). The gold layer 16 is photoetched by a cyanic etchant through a separately provided photoresist (not shown). The molybdenum layer 15 and niobium layer 14 are etched by plasma to provide the prescribed pattern, followed by the removal of the photoresist (FIG. 3G). The structure shown in FIG. 3G is heated to a temperature of about 500° C. to alloy the niobium layer 14 with the substrate body 11. A layer 17 of gold-germanium alloy acting as an ohmic electrode is thermally deposited in vacuum on the backside of the substrate body 11. Finally, a mixer diode is provided after thermal treatment (alloying) (FIG. 3H). FIG. 4 is a plan view of the mixer diode thus obtained.

In the above-mentioned manufacture of the mixer diode, the PSG layer did not peel from the substrate body 11 during heat treatment for the thermal deposition or alloying of the various metal layers included in said mixer diode. Therefore, a Schottky barrier type compound semiconductor device embodying this invention could be produced with an yield over twice greater than the prior art product.

The properties of a mixer diode manufactured by the above-mentioned method of the invention ran as follows:

| | |
|---|---|
| Capacitance at zero bias | 0.1 pF |
| Break-down voltage | 10 to 14V (as measured by backward current of 10 μA) |
| n value denoting forward voltage-current property | less than 1.1 |
| Series resistance | 0.9–1.3 Ω (as measured by a direct current) |
| Cutoff frequency at time of zero bias | more than 850 GHz |

Therefore, the mixer diode of the present invention was proved to have such good properties as approximated the theoretical values.

The PSG layer used as an insulation layer for a Schottky barrier type compound semiconductor device embodying this invention contains phosphorus at a relatively high concentration as described above, and is liable to fall in moisture proofness. However, this problem can be resolved, if the semiconductor device is applied in a state sealed in a highly airtight envelope made of, for example, ceramic material. Further, the problem of the low moisture proofness of the present Schottky barrier type compound semiconductor device can be eliminated by providing a laminated insulation layer prepared, for example, by superposing an $SiO_2$ layer or PSG layer containing phosphorus at a lower concentration than $1 \times 10^{21}/cm^3$ on the aforesaid PSG layer 12. By so doing, even if the Schottky barrier type compound semiconductor device of the invention is sealed in an envelope of plastics material having a lower moisture proofness than the ceramic envelope, no problem is raised.

This invention is applicable not only to the above-mentioned mixer diode, but also to a varactor diode and field effect transistor, etc. These elements can be applied alone to, for example, a microwave integration circuit.

Obviously, numerous modifications and variations of the present invention are possible in light of the above teaching. It is therefore to be understood that within the scope of the appendant claims, the invention may be practiced otherwise than as specifically described herein.

What is claimed as new and desired to be secured by Letters Patent of the United States is:

1. A Schottky barrier type compound semi-conductor device comprising:
    an N type compound semi-conductor substrate;
    an insulation layer which is mounted on the substrate and includes a first layer of phosphosilicate glass directly contacting said substrate and containing phosphorus at a concentration of $1 \times 10^{21}/cm^3$ or more, and is provided with a penetrating hole through which part of the substrate is exposed; and a metal layer comprising a first layer of niobium, tantalum, vanadium, or hafnium so formed as to constitute a Schottky barrier with the substrate, a second layer of molybdenum or tungstun mounted on said first layer and a third layer of gold, silver or platinum deposited on said second layer.

2. The semiconductor device according to claim 1, wherein the semiconductor substrate is formed of gallium arsenide.

3. The semiconductor device according to claim 1, wherein the high melting metal is selected from the group consisting of niobium, tantalum, vanadium, tungsten, hafnium and molybdenum.

4. The semiconductor device according to claim 1, wherein the phosphosilicate glass layer contains phosphorus at a concentration up to $5 \times 10^{21}/cm^3$.

5. The semiconductor device according to claim 1, wherein the phosphosilicate glass layer contains phosphorus at a concentration of 3 to $4 \times 10^{21}/cm^3$.

6. The semiconductor device according to any one of claims 1 to 5, wherein the insulation layer includes a second layer comprising silicon dioxide mounted on the first layer.

7. The semiconductor device according to any one of claims 1 to 5, wherein the insulation layer includes a second layer comprising phosphosilicate glass deposited on the first layer and containing phosphorus at a concentration less than $1 \times 10^{21}/cm^3$.

* * * * *